(12) United States Patent
Jang et al.

(10) Patent No.: US 9,282,666 B2
(45) Date of Patent: Mar. 8, 2016

(54) DISPLAY DEVICE AND METHOD OF MANUFACTURING THE SAME

(71) Applicant: LG DISPLAY CO., LTD., Seoul (KR)

(72) Inventors: Chang Soo Jang, Goyang-si (KR); Jin Ha Lee, Daegu (KR); Jong Young Park, Seoul (KR); Jae Hyung Lee, Gwangmyeong-si (KR)

(73) Assignee: LG DISPLAY CO., LTD., Seoul (KR)

( * ) Notice: Subject to any disclaimer, the term of this patent is extended or adjusted under 35 U.S.C. 154(b) by 317 days.

(21) Appl. No.: 13/864,107

(22) Filed: Apr. 16, 2013

(65) Prior Publication Data

US 2013/0271958 A1   Oct. 17, 2013

(30) Foreign Application Priority Data

Apr. 17, 2012 (KR) .................. 10-2012-0039740

(51) Int. Cl.
*H05K 7/02* (2006.01)
*H05K 13/04* (2006.01)
*G02F 1/1333* (2006.01)

(52) U.S. Cl.
CPC ............ *H05K 7/02* (2013.01); *G02F 1/133308* (2013.01); *H05K 13/04* (2013.01); *G02F 2001/133388* (2013.01); *Y10T 29/49117* (2015.01)

(58) Field of Classification Search
CPC ........ G02F 2001/133331; G02F 2001/133334; G02F 2001/133388; G02F 2001/13356; G02F 2001/133562; G02F 1/133308; G02F 1/133528; G02F 1/13452; H05K 7/02; H05K 13/04; H05K 9/0054
See application file for complete search history.

(56) References Cited

U.S. PATENT DOCUMENTS

| | | | | |
|---|---|---|---|---|
| 8,488,335 B2 * | 7/2013 | Yamada | ............... | H05K 9/0039 361/818 |
| 8,692,948 B2 * | 4/2014 | Park | .................... | G02F 1/13338 349/12 |
| 8,866,759 B2 * | 10/2014 | Furusawa | ............. | G06F 1/1626 345/173 |
| 2009/0284946 A1 * | 11/2009 | Yang | .................... | H05K 1/0218 361/818 |
| 2010/0315570 A1 | 12/2010 | Mathew et al. | | |
| 2014/0063433 A1 * | 3/2014 | Benson | ................. | G02F 1/1341 349/155 |

FOREIGN PATENT DOCUMENTS

CN   102236182 A   11/2011

* cited by examiner

*Primary Examiner* — Alan Cariaso
(74) *Attorney, Agent, or Firm* — Birch, Stewart, Kolasch & Birch, LLP

(57) ABSTRACT

Discussed is a display device and a method of manufacturing the same, wherein the display comprises an upper substrate; a lower substrate provided under the upper substrate, wherein the lower substrate extends to be longer than the upper substrate so as to expose a pad region provided at one side of the lower substrate; a panel driver on the pad region of the lower substrate; an exposure prevention member formed on the panel driver, for preventing the panel driver from being exposed to the external; and an upper film formed on the exposure prevention member.

14 Claims, 9 Drawing Sheets

DISPLAY DEVICE AND METHOD OF MANUFACTURING THE SAME

CROSS REFERENCE TO RELATED APPLICATIONS

This application claims the benefit of the Korean Patent Application No. 10-2012-0039740 filed on Apr. 17, 2012, which is hereby incorporated by reference as if fully set forth herein.

BACKGROUND OF THE INVENTION

1. Field of the Invention

Embodiments of the present invention relate to a display device, and more particularly, to a display device with thin profile and good exterior appearance.

2. Discussion of the Related Art

Various display devices, which substitute for Cathode Ray Tube (CRT) manufactured in an early stage of display device, have been researched and studied, for example, Liquid Crystal Display (LCD) device, Plasma Display Panel (PDP), Organic Light Emitting Display (OLED) device, and etc.

These display devices enable to achieve large size by decreasing weight and volume. Also, these display devices have been highly developed in various aspects such as response speed and picture quality through the continuous study.

In addition to the research and development in technical aspects, design aspects of a product that can appeal to consumers have been actively researched and studied. For example, efforts to minimize a thickness of a display device have been made, and a design enabling the good exterior appearance has been developed to expedite purchase of consumers by appealing to aesthetic sense of the consumers.

However, the related art display device obtained up to now has limitation in minimization of thickness and improvement of exterior appearance due to its structural properties. Hereinafter, limitation of the related art display device will be described in detail with reference to the accompanying drawings.

FIG. 1 is a cross sectional view of the related art display device.

As shown in FIG. 1, the related art display device includes a display panel 10, a panel driver 20, and an exterior case 30.

The display panel 10 includes a lower substrate 12 and an upper substrate 14.

On the lower substrate 12, there are gate and data lines crossing each other to define a pixel region. At a crossing portion of the gate and data lines, there is a thin film transistor. Also, a pixel electrode connected with the thin film transistor is formed in the pixel region.

The upper substrate 14 is located over the lower substrate 12. In this case, a predetermined portion of a peripheral region of the lower substrate 12 has to be exposed to the external so as to apply a signal to the gate and data lines on the lower substrate 12, whereby the upper substrate 14 is not located over the predetermined portion of the peripheral region of the lower substrate 12.

The panel driver 20 is formed in the predetermined portion of the peripheral region of the lower substrate 12 exposed to the external, to thereby transmit the signal to the gate and data lines.

The exterior case 30 covers peripheral regions of the display panel 10. As mentioned above, since the panel driver 20 is formed in the predetermined portion of the peripheral region of the lower substrate 12, it is necessary to prevent the panel driver 20 from being exposed to the external. To this end, the exterior case 30 is applied thereto.

Accordingly, the exterior case 30 covers the peripheral regions of the display panel 10 so as to prevent the panel driver 20 from being exposed to the external. The structure might cause the following problems.

First, the exterior case 30 is formed above the upper substrate 14, whereby a thickness of the display device is increased.

Also, the exterior case 30 protruding above the upper substrate 14 causes a height difference on a front surface of the display device, thereby deteriorating the exterior appearance of the display device.

Also, a width of bezel in the display device is increased due to the exterior case 30, thereby causing the deteriorated exterior appearance of the display device.

SUMMARY OF THE INVENTION

Accordingly, the present invention is directed to a display device and a method of manufacturing the same that substantially obviates one or more problems due to limitations and disadvantages of the related art.

An aspect of the present invention is to provide a display device with thin profile and good exterior appearance, and a method of manufacturing the same.

To achieve these and other advantages and in accordance with the purpose of the invention, as embodied and broadly described herein, there is provided a display device that may include an upper substrate; a lower substrate provided under the upper substrate, wherein the lower substrate extends to be longer than the upper substrate so as to expose a pad region provided at one side of the lower substrate; a panel driver on the pad region of the lower substrate; an exposure prevention member formed on the panel driver, for preventing the panel driver from being exposed to the external; and an upper film formed on the exposure prevention member.

In another aspect of an embodiment of the present invention, there is provided a method of manufacturing a display device that may include bonding lower and upper substrates to each other, and then connecting a panel driver to a pad region of the lower substrate; forming an exposure prevention member on the panel driver so as to prevent the panel driver from being exposed to the external; and forming an upper film on the exposure prevention member.

In another aspect of an embodiment of the present invention, there is provided a method of manufacturing a display device that may include bonding lower and upper substrates to each other, and then connecting a panel driver to a pad region of the lower substrate; forming an upper film on the upper substrate, wherein the upper film extends to an upper portion of the panel driver so as to provide a predetermined space between the upper film and the panel driver; and forming an exposure prevention member in the predetermined space provided between the upper film and the panel driver.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, a display device according to the present invention will be described with reference to the accompanying drawings.

Figure 1:
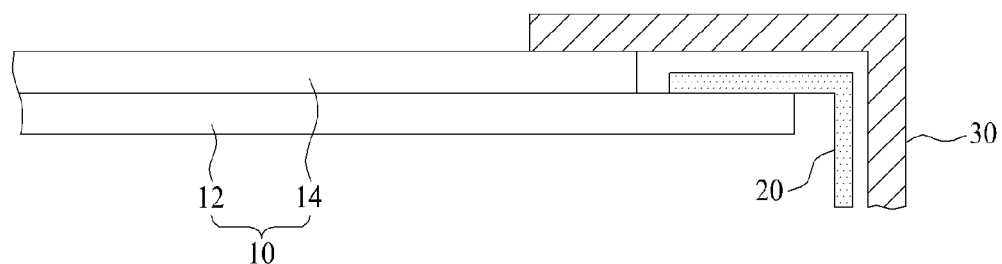
FIG. 1 is a cross sectional view of a related art display device.
Figure 2A:
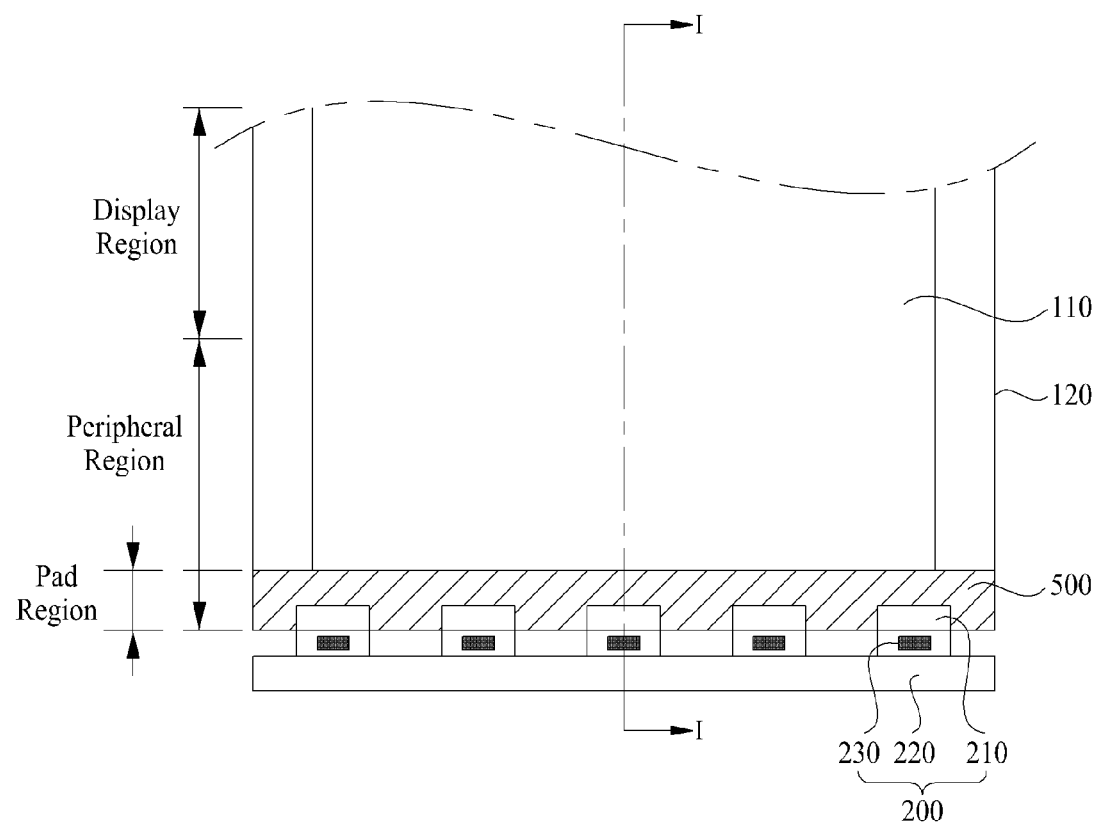
FIG. 2A is a plane view of a display device according to one embodiment of the present invention.
Figure 2B:
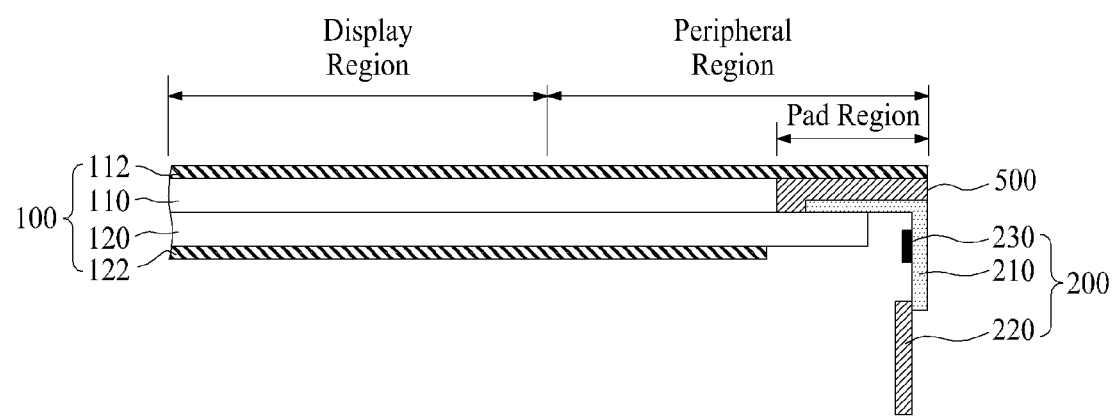
FIG. 2B is a cross sectional view along I-I of FIG. 2A.

FIG. 2A is a plane view of a display device according to one embodiment of the present invention, and FIG. 2B is a cross sectional view along I-I of FIG. 2A.

As shown in FIGS. 2A and 2B, the display device according to one embodiment of the present invention includes a display panel 100, a panel driver 200 connected with the display panel 100, and an exposure prevention member 500 for preventing an exposure of the panel driver 200.

The display panel 100 includes a display region on which an image is displayed, and a peripheral region surrounding the display region. A pad region is formed in the peripheral region. In the pad region, a pad is exposed, and the panel driver 200 is connected with the exposed pad. Thus, a signal may be applied to the display panel 100 by the panel driver 200.

The display panel 100 includes an upper substrate 110 and a lower substrate 120. If the display panel 100 is a liquid crystal panel, a liquid crystal layer sealed by a sealant is formed between the upper substrate 110 and the lower substrate 120.

Although not shown, on the upper substrate 110, and more particularly, on a lower surface of the upper substrate 110 confronting the lower substrate 120, there are a light-shielding layer of a matrix configuration to prevent a light leakage, red, green and blue color filter layers formed between each light-shielding layer, and an overcoat layer formed on the color filter layer.

On an upper surface of the upper substrate 110, there is a first upper film 112. The first upper film 112 extends to an upper surface of the exposure prevention member 500, that is, the first upper film 112 is formed on the upper surface of the exposure prevention member 500. Especially, the first upper film 112 may be formed on an entire upper surface of the exposure prevention member 500 so as to prevent the upper surface of the exposure prevention member 500 from being exposed.

The first upper film 112 may be formed of an upper polarizing plate. The first upper film 112 is formed on a front surface of the display device. Thus, any element is not formed on an upper surface of the first upper film 112.

Although not shown, on the lower substrate 120, and more particularly, on an upper surface of the lower substrate 120 confronting the upper substrate 110, there are gate and data lines, a thin film transistor, and a pixel electrode. In this case, the gate and data lines crossing each other define a pixel region, and the thin film transistor which functions as a switching element is formed at a crossing region of the gate and data lines. Also, the pixel electrode is formed in each pixel region, wherein the pixel electrode is connected with the thin film transistor.

In order to apply signals to the gate and data lines, a pad is formed at each one end of the gate and data lines. The pad is exposed to the external, and the exposed pad is connected with the panel driver 200. Thus, in order to expose the pad region, one side of the lower substrate 120 extends to be longer than one side of the upper substrate 110.

On a lower surface of the lower substrate 120, there is a lower film 122. The lower film 122 may be formed of a lower polarizing plate.

Meanwhile, a detailed structure of the upper substrate 110 and lower substrate 120 may be changed in various shapes generally known to those in the art, according to a driving mode of liquid crystal layer, for example, Twisted Nematic (TN) mode, Vertical Alignment (VA) mode, In-Plane Switching (IPS) mode, Fringe Field Switching (FFS) mode, and etc.

The panel driver 200 is connected with the peripheral region of the display panel 100, and more particularly, the pad region.

The panel driver 200 may include a circuit film 210, a printed circuit board (PCB) 220, and a driving chip 230.

The circuit film 210 may be attached to the pad region of the display panel 100. The PCB 220 is connected with the circuit film 210, whereby the PCB 220 supplies various signals to the display panel 100 through the circuit film 210. Although not shown, a timing controller, various power circuits, or memory device may be provided in the PCB 220. The driving chip 230 is formed on the circuit film 210. In this case, a COF (Chip On Film) structure may be made by forming the driving chip 230 such as a data driving integrated circuit on the circuit film 210, but it is not limited to this structure. For example, a COG (Chip On Glass) structure may be made by forming the chip on the display panel 100.

The exposure prevention member 500 prevents the panel driver 200 from being exposed to the external. The exposure prevention member 500 is formed on the panel driver 200, and more particularly, on the circuit film 210. Especially, the exposure prevention member 500 may cover an entire upper surface of the panel driver 200. Also, the exposure prevention member 500 may be formed in the entire pad region provided with the panel driver 200.

The exposure prevention member 500 may include a light-shielding material so as to prevent an exposure of the panel driver 200. Also, the exposure prevention member 500 may shield the pad and the panel driver 200 from external signals. To this end, the exposure prevention member 500 may include an electromagnetic shielding material. In this case, carbon may be used as the light-shielding material and electromagnetic shielding material, but not necessarily.

The exposure prevention member 500 may be formed in a film structure, but not necessarily. The exposure prevention member 500 may be formed by curing a predetermined polymer resin.

A height of an upper surface of the exposure prevention member 500 may be the same as a height of an upper surface of the upper substrate 110. Thus, the first upper film 112 may be formed flat on the upper substrate 110 and the exposure prevention member 500 without being curved.

According to one embodiment of the present invention, the exposure prevention member 500 is formed on the panel driver 200 so that it is possible to prevent the panel driver 200 from being exposed to the external. Also, according as the first upper film 112 extends to the upper surface of the exposure prevention member 500, only the first upper film 112 is formed on the front surface of the display device. Thus, a height different is removed from the front surface of the display device, whereby the front surface of the display device is recognized as one body, thereby obtaining an effect of good design.

There is no need to additionally provide an external case for covering the panel driver 200, which is necessarily required for the related art, on the upper surface of the upper substrate 110. As a result, it is possible to decrease a thickness of the display device, and also to reduce a width of a bezel.

Figure 3:
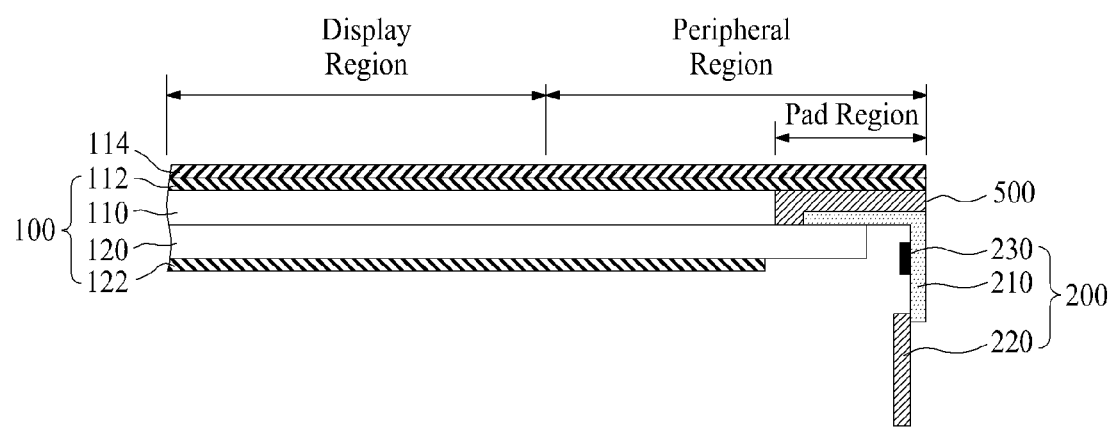
FIG. 3 is a cross sectional view of a display device according to another embodiment of the present invention.

FIG. 3 is a cross sectional view of a display device according to another embodiment of the present invention. Except that a second upper film 114 is provided additionally, the display device according to another embodiment of the present invention is identical in structure to the above display device shown in FIGS. 2A and 2B, whereby the same reference numbers will be used throughout the drawings to refer to the same or like parts, and a detailed explanation for the same parts will be omitted.

As shown in FIG. 3, a first upper film 112 is formed on upper surfaces of an upper substrate 110 and an exposure prevention member 500, and a second upper film 114 is formed on the first upper film 112.

The second upper film 114 may be formed of a stereoscopic optical member which converts 2-dimentional image into 3-dimensional image. For example, the second upper film 114 may be formed of a retarder film to separate left and right images.

Figure 4:
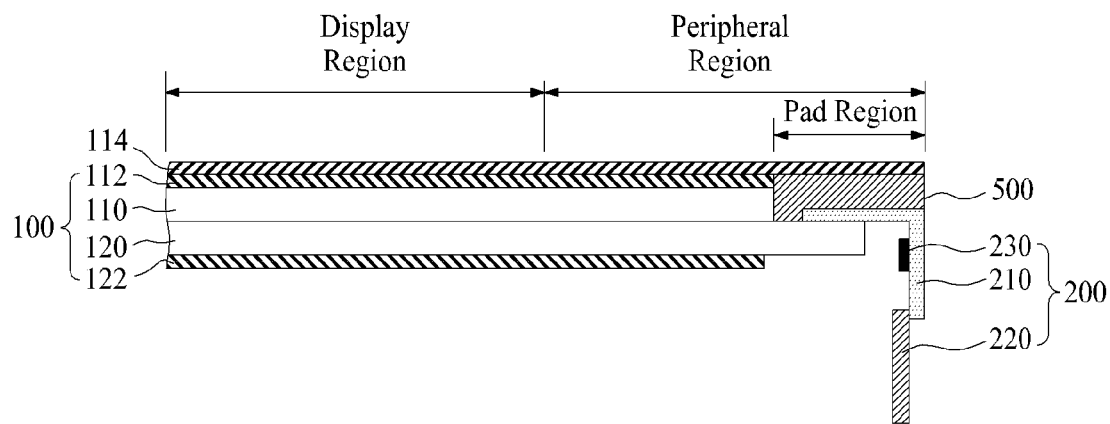
FIG. 4 is a cross sectional view of a display device according to another embodiment of the present invention.

FIG. 4 is a cross sectional view of a display device according to another embodiment of the present invention. Except that a first upper film 112 and an exposure prevention member 500 are changed in structure, the display device of FIG. 4 is identical in structure to the above display device of FIG. 3, whereby the same reference numbers will be used throughout the drawings to refer to the same or like parts, and a detailed explanation for the same parts will be omitted.

According to the above display device of FIG. 3, the first upper film 112 extends to the upper surface of the exposure prevention member 500. Meanwhile, in case of the display device shown in FIG. 4, a first upper film 112 is formed only on an upper surface of an upper substrate 110, and the first upper film 112 does not extend to an upper surface of an exposure prevention member 500.

In FIG. 4, a second upper film 114 is formed on the upper surface of the exposure prevention member 500. That is, the second upper film 114 is formed on an upper surface of the first upper film 112, and the second upper film 114 extends to the upper surface of the exposure prevention member 500.

Also, a height of the upper surface of the exposure prevention member 500 may be the same as a height of the upper surface of the first upper film 112. Accordingly, the second upper film 114 may be formed flat on the first upper film 112 and the exposure prevention member 500 without being curved.

Figure 5:
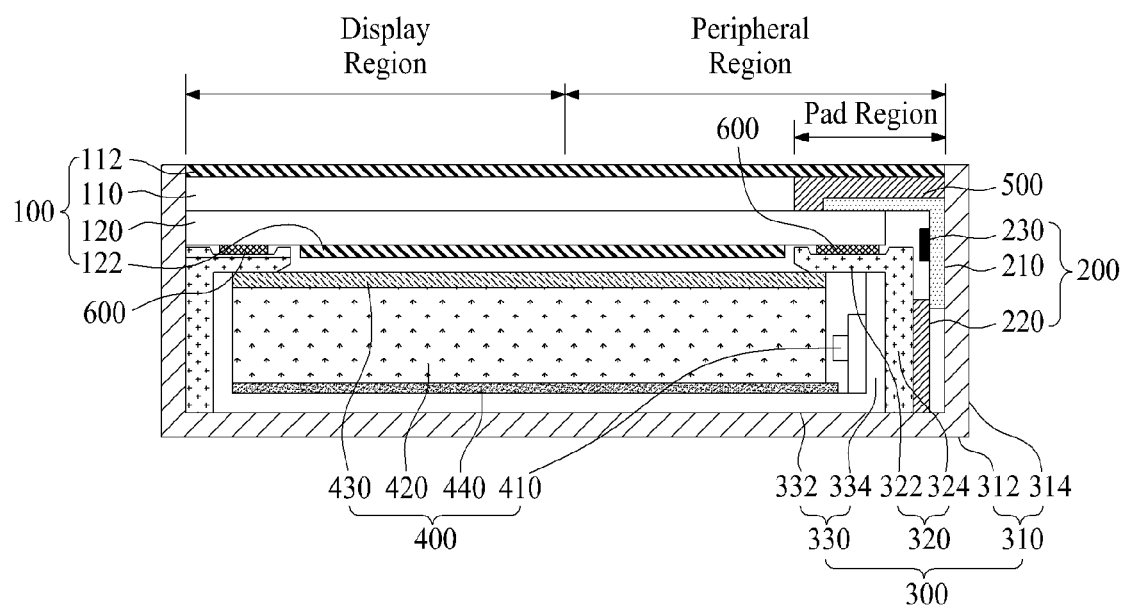
FIG. 5 is a cross sectional view of an LCD device according to one embodiment of the present invention.

FIG. 5 is a cross sectional view of an LCD device according to one embodiment of the present invention, which applies a structure of the above display device shown in FIGS. 2A and 2B.

As shown in FIG. 5, the LCD device according to one embodiment of the present invention may include a display panel 100, a panel driver 200, an exposure prevention member 500, a support member 300, a backlight unit 400, and a connection member 600.

The display panel 100, the panel driver 200, and the exposure prevention member 500 are identical in structure to those shown in FIGS. 2A and 2B, whereby a detailed explanation for their structures will be omitted. However, the display panel 100, the panel driver 200, and the exposure prevention member 500 may be identical in structure to those shown in FIG. 3 or FIG. 4.

The support member 300 supports the display panel 100, the panel driver 200, and the backlight unit 400, and functions as an external cover. In more detail, the support member 300 may include a set cover 310, a guide frame 320, and a support case 330.

The set cover 310 functions as an external cover of the LCD device such as notebook computer or television set. Especially, the set cover 310 functions as lower and lateral covers of the LCD device. To this end, the set cover 310 includes a plate 312, and a sidewall 314 extending and bent from one end of the plate 312.

The plate 312 functions as the lower cover of the LCD device, and the sidewall 314 functions as the lateral cover of the LCD device. The sidewall 314 faces a lateral surface of the display panel 100, whereby the sidewall 314 forms a bezel of the LCD device. Thus, in comparison to the related art, a width of bezel is largely reduced. In this case, a height of the sidewall 314 is the same as a height of an upper surface of the display panel 100. More specifically, a height in an end of the sidewall 314 is the same as a height in an upper surface of a first upper film 112, whereby the LCD has an entirely-flat front surface.

The set cover 310 is provided with a predetermined space prepared by combining the set plate 312 and the sidewall 314. The display panel 100, the panel driver 200, the guide frame 320, the support case 330, and the backlight unit 400 are received in the predetermined space.

The guide frame 320 guides the position of the backlight unit 400, and supports the display panel 100. To this end, the guide frame 320 may include a first support 322 and a first guide 324.

The first support 322 supports the lower surface of the display panel 100, especially, the lower edge of the lower substrate 120. The first guide 324 extends from the first support 322, and guides the position of support case 330 and backlight unit 400. Also, a PCB 220 of the panel driver 200 may be fixed to the first guide 324 by a double-sided adhesive.

The support case 330 guides the position of the backlight unit 400, and supports the backlight unit 400. To this end, the support case 330 may include a second support 332 and a second guide 334.

The second support 332 supports the lower surface of the backlight unit 400. The second guide 334 extends from the second support 332, and guides the position of the backlight unit 400 while facing the lateral surface of the backlight unit 400.

Also, the support case 330 uniformly transmits heat generated from the backlight unit 400, to thereby discharge the heat. That is, since heat is generated in the backlight unit 400, a device for discharging the heat generated from the backlight unit 400 might be needed. Thus, if the support case 330 is formed of a metal material enabling heat conduction, the heat generated from the backlight unit 400 may be discharged to the outside through the support case 330. However, the support case 330 may be omitted if needed. In this case, the backlight unit 400 may be supported by the aforementioned set cover 310.

The connection among the set cover 310, the guide frame 320 and the support case 330 constituting the support member 300, that is, the connection between the set cover 310 and the guide frame 320, the connection between the set cover 310 and the support case 330, or the connection between the guide frame 320 and the support case 330 may be completed by the use of double-sided adhesive, by the use of hook connection using groove and projector, or by the use of bolt and nut.

The backlight unit 400 may be positioned under the display panel 100, whereby the backlight unit 400 supplies light to the display panel 100. As mentioned above, the position of the backlight unit 400 may be guided by the guide frame 320 and the support case 330.

The backlight unit 400 may be classified into a direct type and an edge type. In case of the direct type, a light source is positioned under an entire lower surface of the display panel 100, whereby light emitted from the light source is directly transmitted to the display panel 100. Meanwhile, in case of the edge type, a light source is positioned at one lower side of the display panel 100, whereby light emitted from the light source is transmitted to the display panel 100 through a light guide plate. The present invention may be applied to any one of the direct type and the edge type. In the drawings, the edge-type backlight unit 400 is illustrated, but it is not limited to the edge type.

The backlight unit 400 may include a light source 410, a light guide plate 420, an optical sheet 430, and a reflective plate 440.

The light source 410 is provided to face the lateral side of the light guide plate 420. The light emitted from the light source 410 is incident on the light guide plate 420, and then the path of light incident on the light guide plate 420 is changed toward the display panel 100. The light source 410 may be light-emitting diode or fluorescent lamp.

The light guide plate 420 changes the path of light emitted from the light source 410 toward the display panel 100. For the change of light path, although not shown, the light guide plate 420 may be provided with grove patterns or project patterns formed in various shapes.

The optical sheet 430 is formed on the light guide plate 420, wherein the optical sheet 430 uniformly supplies the light toward the display panel 100. The optical sheet 430 may be formed by combination of diffusion sheet and prism sheet.

The reflective plate 440 is formed under the light guide plate 420, wherein the reflective plate 440 reflects the light leaking in the light guide plate 420 upward, to thereby improve light efficiency.

The connection member 600 connects the display panel 100 with the support member 300. In more detail, the connection member 600 is formed between the display panel 100 and the guide frame 320, to thereby connect the display panel 100 with the guide frame 320. That is, the connection member 600 prevents the display panel 100 from being separated upward. The connection member 600 may be formed of an adhesive such as double-sided tape.

Meanwhile, a lower film 122 of the display panel 100 is not formed in the area provided with the connection member 600. That is, the connection member 600 is formed between the lower substrate 120 and the first support 322 of the guide frame 320, to thereby prevent the thickness of display device from being increased by addition of the connection member 600.

FIGS. 6A to 6D are cross sectional views illustrating a method of manufacturing an LCD device according to one embodiment of the present invention.

Figure 6A:
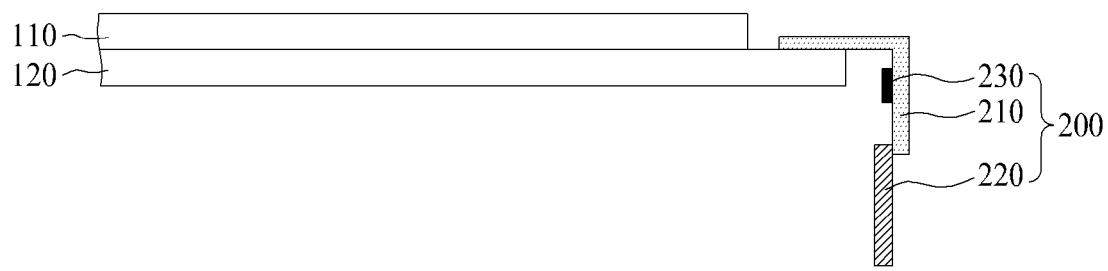
FIGS. 6A to 6D are cross sectional views illustrating a method of manufacturing an LCD device according to one embodiment of the present invention.

First, as shown in FIG. 6A, a bonding substrate is manufactured by bonding an upper substrate 110 and a lower substrate 120. Then, a panel driver 200 is connected with the lower substrate 120, and more particularly, a pad region of the lower substrate 120.

The upper substrate 110, the lower substrate 120, and the panel driver 200 are the same as described above. A bonding process of the upper substrate 110 and the lower substrate 120, and a process of connecting the panel driver 200 with the lower substrate 120 are may be carried out by various methods generally known to those in the art.

Figure 6B:
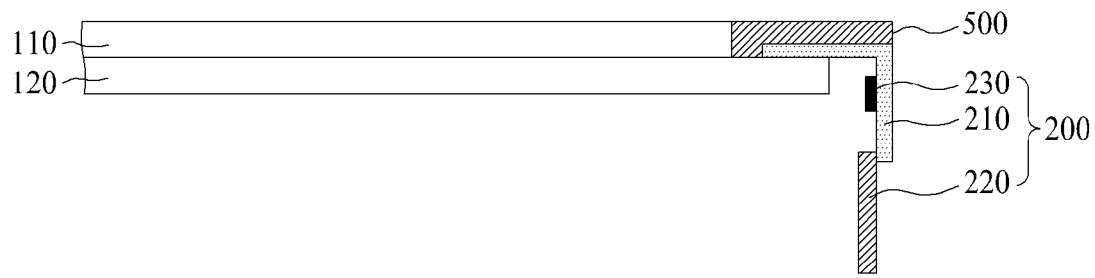

Then, as shown in FIG. 6B, an exposure prevention member 500 is formed on the panel driver 200.

A process of forming the exposure prevention member 500 may be carried out by attaching a predetermined film structure to the panel driver 200 through the use of adhesive, but it is not limited. A detailed structure of the exposure prevention member 500 is the same as described above.

A height of an upper surface of the exposure prevention member 500 may be the same as a height of an upper surface of the upper substrate 110.

Figure 6C:
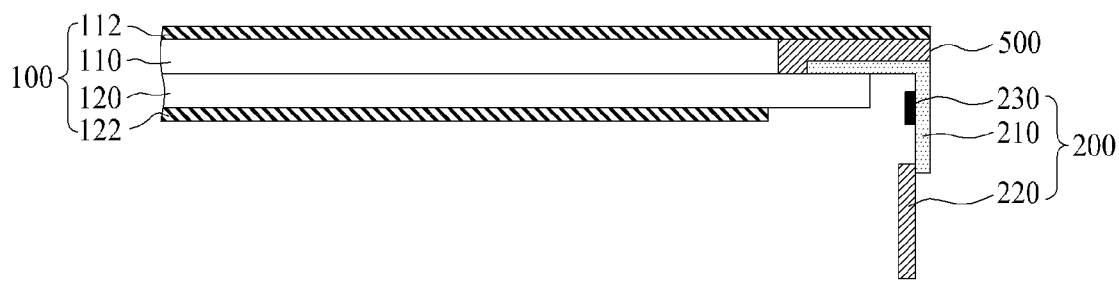

Then, as shown in FIG. 6C, a first upper film 112 is formed on an upper surface of the upper substrate 110 and exposure prevention member 500, and a lower film 122 is formed on a lower surface of the lower substrate 120.

A detailed structure of the first upper film 112 and the lower film 122 is the same as described above. A process of forming the lower film 122 on the lower substrate 120 may be carried out before the process of forming the exposure prevention member 500. For example, the lower film 122 may be formed before a process of connecting the panel driver 200.

Meanwhile, although not shown, an aforementioned second upper film 114 may be additionally formed on the first upper film 112.

Figure 6D:
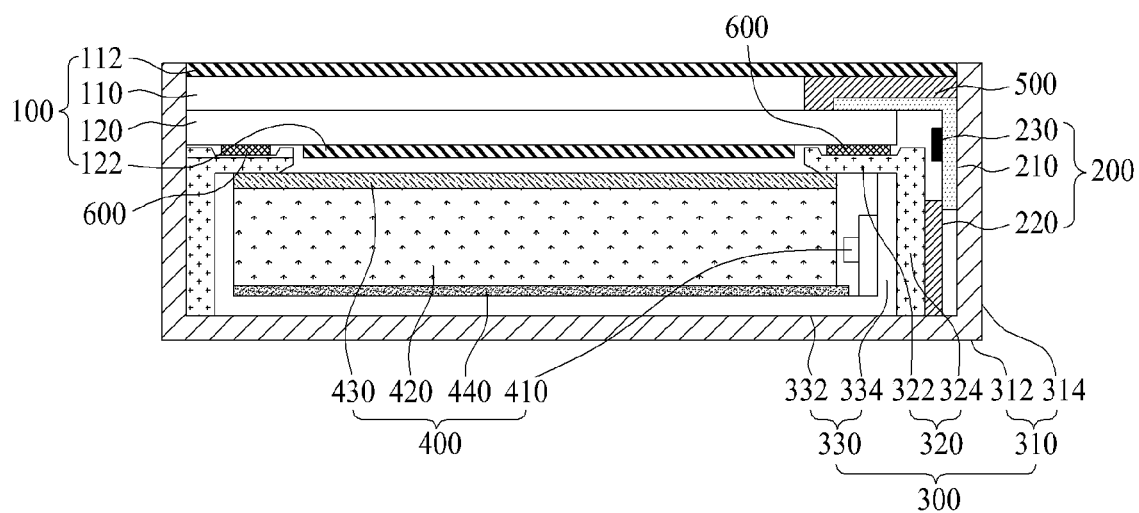

As shown in FIG. 6D, after a backlight unit 400 is positioned under the lower substrate 120, a support member 300 functioning as an external cover is formed to support the upper substrate 110, the lower substrate 120, the panel driver 200 and the backlight unit 400.

The support member 300 is combined with the lower substrate 120 through a connection member 600. A detailed structure of the support member 300 and the backlight unit 400 is the same as described above.

FIGS. 7A to 7D are cross sectional views illustrating a method of manufacturing an LCD device according to another embodiment of the present invention, wherein a detailed explanation for structures which are the same as those of the aforementioned embodiment of the present invention will be omitted.

Figure 7A:
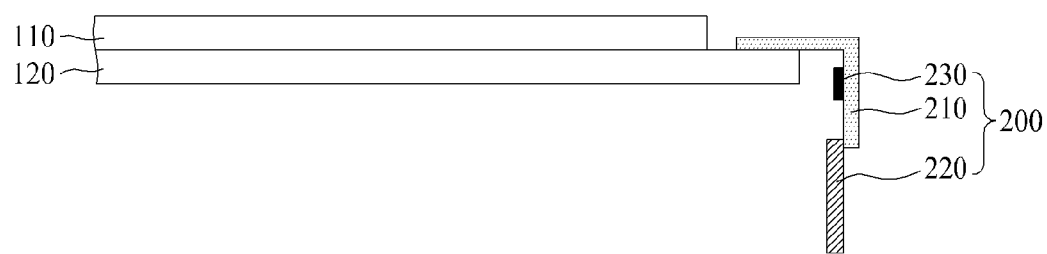
FIGS. 7A to 7D are cross sectional views illustrating a method of manufacturing an LCD device according to another embodiment of the present invention.

First, as shown in FIG. 7A, a bonding substrate is manufactured by bonding an upper substrate 110 and a lower substrate 120. Then, a panel driver 200 is connected with the lower substrate 120, and more particularly, a pad region of the lower substrate 120.

Figure 7B:
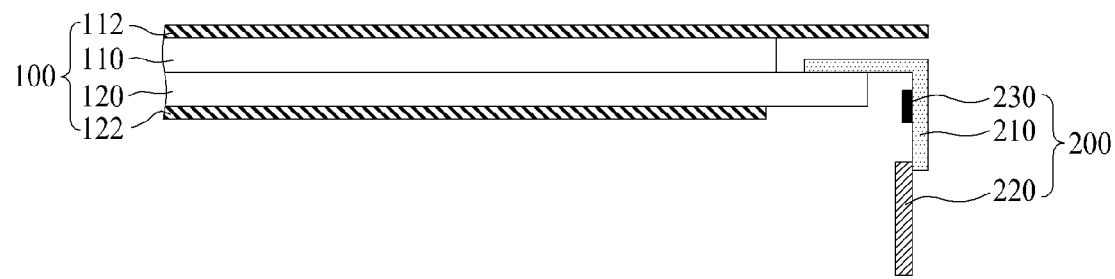

As shown in FIG. 7B, a first upper film 112 is formed on the upper substrate 110, and a lower film 122 is formed on the lower substrate 120.

The first upper film 112 extends to be longer than the upper substrate 110. In more detail, the first upper film 112 extends to an upper portion of the panel driver 200, whereby a predetermined space is formed between the first upper film 112 and the panel driver 200.

Meanwhile, although not shown, an aforementioned second upper film 114 may be additionally formed on the first upper film 112.

Figure 7C:

As shown in FIG. 7C, an exposure prevention member 500 is formed in the predetermined space provided between the first upper film 112 and the panel driver 200.

A process of forming the exposure prevention member 500 may be carried out by filling the predetermined space with a predetermined material through the use of nozzle.

Figure 7D:
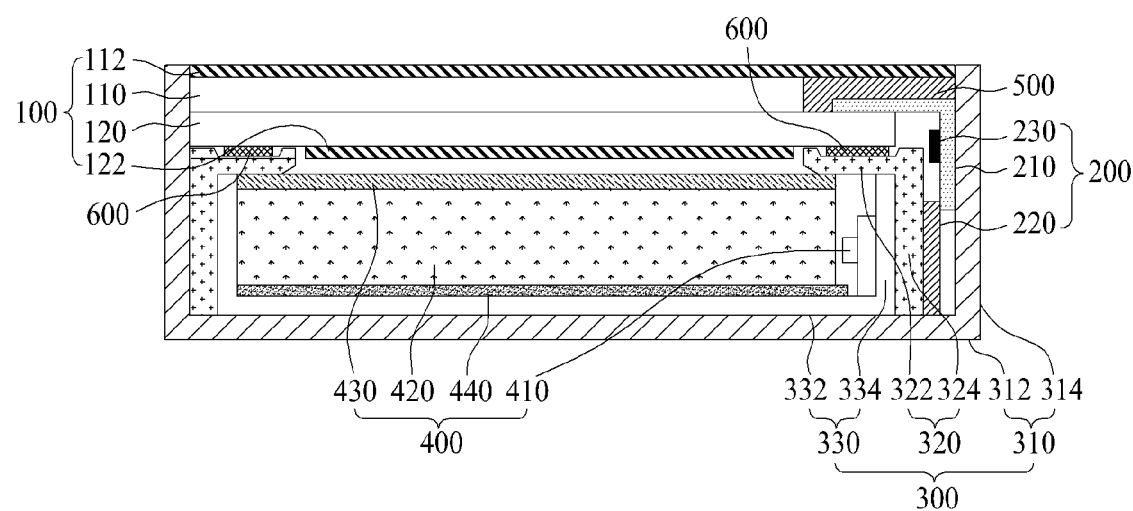

Then, as shown in FIG. 7D, after a backlight unit 400 is positioned under the lower substrate 120, a support member 300 functioning as an external cover is formed to support the upper substrate 110, the lower substrate 120, the panel driver 200 and the backlight unit 400.

FIGS. 8A to 8D are cross sectional views illustrating a method of manufacturing an LCD device according to another embodiment of the present invention, wherein a detailed explanation for structures which are the same as those of the aforementioned embodiment of the present invention will be omitted.

Figure 8A:
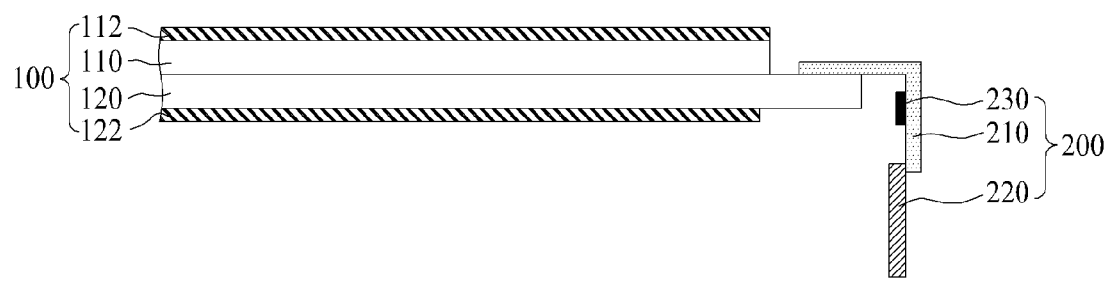
FIGS. 8A to 8D are cross sectional views illustrating a method of manufacturing an LCD device according to another embodiment of the present invention.

First, as shown in FIG. 8A, a bonding substrate is manufactured by bonding an upper substrate 110 and a lower substrate 120. Then, a first upper film 112 is formed on the upper substrate 110, and a lower film 122 is formed on the lower substrate 120. After that, a panel driver 200 is connected with the lower substrate 120, and more particularly, a pad region of the lower substrate 120.

Figure 8B:
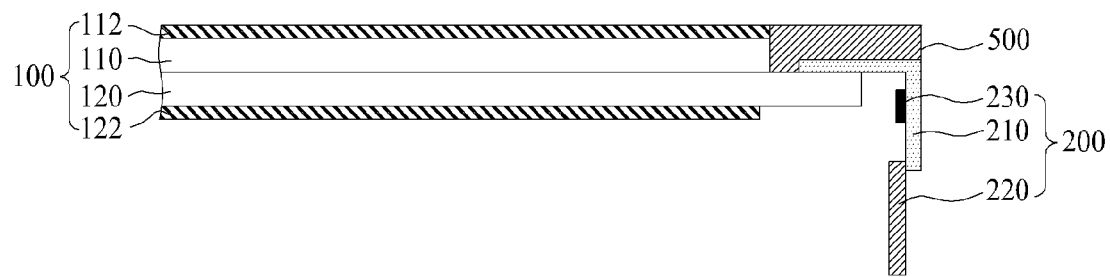

As shown in FIG. 8B, an exposure prevention member 500 is formed on the panel driver 200.

A height of an upper surface of the exposure prevention member 500 may be the same as a height of an upper surface of the first upper film 112.

Figure 8C:
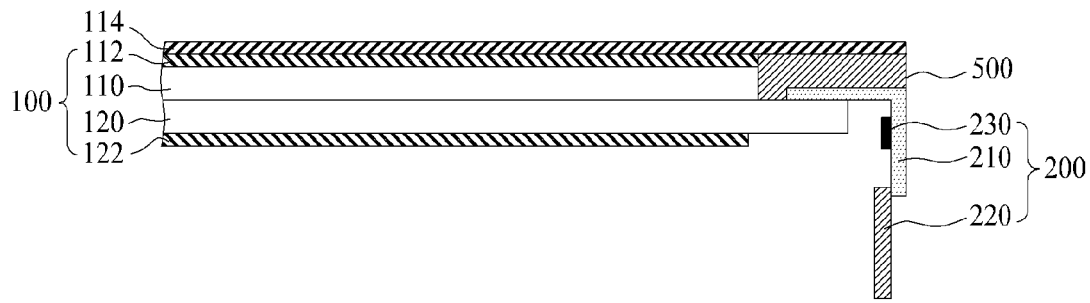

Then, as shown in FIG. 8C, a second upper film 114 is formed on the first upper film 112 and the exposure prevention member 500.

Figure 8D:
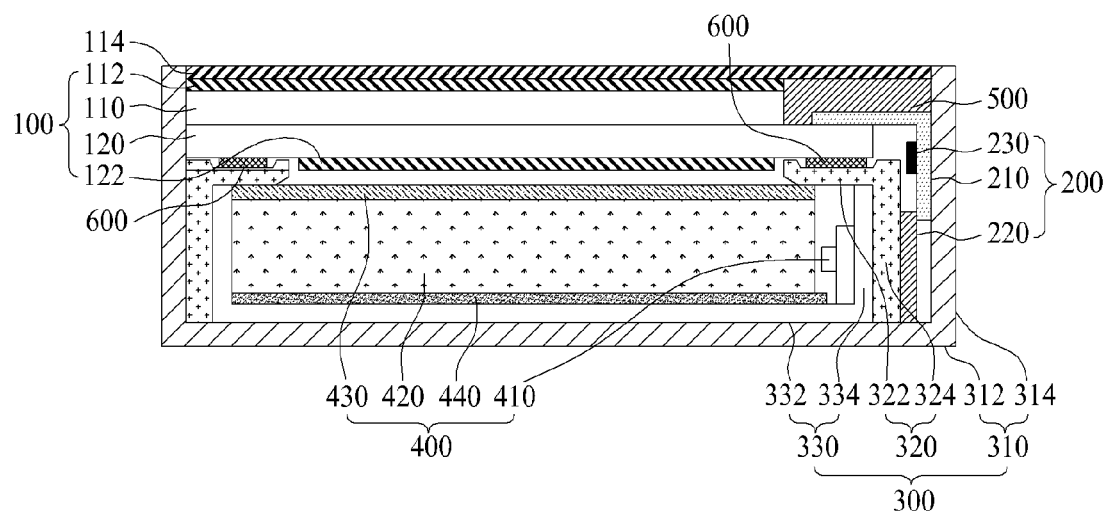

As shown in FIG. 8D, after a backlight unit 400 is positioned under the lower substrate 120, a support member 300 functioning as an external cover is formed to support the upper substrate 110, the lower substrate 120, the panel driver 200 and the backlight unit 400.

The above embodiments of the present invention are applied to the LCD device, that is, one of display devices, but it is not limited to the LCD device. The embodiments of the present invention may be applied to various display devices, for example, an organic light emitting display device.

According to the embodiments of the present invention, the exposure prevention member 500 is formed on the panel driver 200, to thereby prevent the panel driver 200 from being exposed to the external. Also, the upper film extends to the upper surface of the exposure prevention member 500 so that the front surface of the display device is provided only with the upper film. Thus, the height different is removed from the front surface of the display device, whereby the front surface of the display device is recognized as one body, thereby obtaining an effect of good design.

Unlike the related art which inevitably requires the external case on the upper surface of the upper substrate so as to cover the panel driver, the embodiments of the present invention have no need to provide the additional external case, to thereby decrease the thickness of display device, and to reduce the width of bezel.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device comprising: an upper substrate; a lower substrate provided under the upper substrate, wherein the lower substrate extends to be longer than the upper substrate so as to expose a pad region provided at one side of the lower substrate; a panel driver on the pad region of the lower substrate; an exposure prevention member formed on a circuit film of the panel driver, for preventing the panel driver from being exposed to the external, wherein the circuit film is disposed only on the pad region; and an upper film formed flat on the upper substrate and the exposure prevention member without being curved.

2. The display device of claim 1, wherein the exposure prevention member is formed on an entire area of the pad region provided with the panel driver.

3. The display device of claim 1, wherein the upper film includes a first upper film formed on the upper substrate and the exposure prevention member, and a second upper film formed on the first upper film.

4. The display device of claim 3, wherein a height of an upper surface of the exposure prevention member is the same as a height of an upper surface of the upper substrate.

5. The display device of claim 1, wherein the upper film includes a first upper film formed on the upper substrate, and a second upper film formed on the first upper film and the exposure prevention member.

6. The display device of claim 5, wherein a height of an upper surface of the exposure prevention member is the same as a height of an upper surface of the first upper film.

7. The display device of claim 1, further comprising:
a backlight unit positioned under the lower substrate; and
a support member for supporting the upper substrate, the lower substrate, and the backlight unit,
wherein the support member includes a set cover facing a lateral side of the upper substrate, and a height of an end of the set cover is the same as a height of the upper surface of the upper film.

8. The display device of claim 1, wherein the exposure prevention member is provided between the panel driver and the upper film.

9. The display device of claim 1, wherein an entire upper surface of the upper film is exposed to an exterior.

10. The display device of claim 1, wherein the exposure prevention member includes an electromagnetic shielding material.

11. A display device comprising:
an upper substrate;
a lower substrate provided under the upper substrate, wherein the lower substrate extends longer than the upper substrate so as to expose a pad region provided at one side of the lower substrate;
a panel driver on the pad region of the lower substrate;
an exposure prevention member formed on the panel driver, for preventing the panel driver from being exposed to an external; and
an upper film formed on the exposure prevention member, wherein the upper film includes a first upper film formed on the upper substrate, and a second upper film formed on the first upper film and the exposure prevention member, and
wherein a height of an upper surface of the exposure prevention member is the same as a height of an upper surface of the first upper film.

12. The display device of claim 11, further comprising:
a backlight unit positioned under the lower substrate; and
a support member for supporting the upper substrate, the lower substrate, and the backlight unit,
wherein the support member includes a set cover facing a lateral side of the upper substrate, and a height of an end of the set cover is the same as a height of the upper surface of the upper film.

13. The display device of claim 11, wherein the exposure prevention member is formed on an entire area of the pad region provided with the panel driver.

14. A display device comprising: an upper substrate; a lower substrate provided under the upper substrate, wherein the lower substrate extends longer than the upper substrate so as to expose a pad region provided at one side of the lower substrate; a panel driver on the pad region of the lower substrate, the panel driver including a circuit film attached only to the pad region of the lower substrate, and a printed circuit board connected with the circuit film; an exposure prevention member formed on the panel driver, for preventing the panel driver from being exposed to the external; an upper film formed on the exposure prevention member; and a guide frame guiding a position of a backlight, the guide frame including a first support supporting a lower surface of the lower substrate and a first guide extending from the first support to guide the position of the backlight unit, wherein the printed circuit board of the panel driver is fixed to the first guide of the guide frame.

\* \* \* \* \*